(12) United States Patent
Lee

(10) Patent No.: US 9,485,878 B2
(45) Date of Patent: Nov. 1, 2016

(54) SUBSTRATE STRUCTURE HAVING ELECTRONIC COMPONENTS AND METHOD OF MANUFACTURING SUBSTRATE STRUCTURE HAVING ELECTRONIC COMPONENTS

(71) Applicant: Samsung Electro-Mechanics Co., Ltd., Suwon-si (KR)

(72) Inventor: Jae Soo Lee, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 339 days.

(21) Appl. No.: 13/956,293

(22) Filed: Jul. 31, 2013

(65) Prior Publication Data

US 2014/0111958 A1   Apr. 24, 2014

(30) Foreign Application Priority Data

Oct. 23, 2012 (KR) .......................... 10-2012-0118028

(51) Int. Cl.
  *H05K 3/46*   (2006.01)
  *H05K 1/18*   (2006.01)
  *H05K 1/02*   (2006.01)
  *H05K 3/34*   (2006.01)

(52) U.S. Cl.
  CPC ............ *H05K 3/4697* (2013.01); *H05K 1/185* (2013.01); *H01L 2224/16227* (2013.01); *H01L 2224/16265* (2013.01); *H01L 2924/15313* (2013.01); *H01L 2924/18161* (2013.01); *H01L 2924/19103* (2013.01); *H01L 2924/19104* (2013.01); *H05K 1/0231* (2013.01); *H05K 1/181* (2013.01); *H05K 3/3436* (2013.01); *H05K 2201/1053* (2013.01); *H05K 2201/10636* (2013.01); *H05K 2201/10674* (2013.01); *H05K 2203/1469* (2013.01); *Y02P 70/611* (2015.11); *Y10T 29/49139* (2015.01); *Y10T 29/49142* (2015.01)

(58) Field of Classification Search
  None
  See application file for complete search history.

(56) References Cited

U.S. PATENT DOCUMENTS

| | | | | |
|---|---|---|---|---|
| 5,646,828 A | * | 7/1997 | Degani | ................... H01L 23/13 257/707 |
| 5,963,429 A | * | 10/1999 | Chen | ................... H01L 25/0652 257/686 |
| 6,228,682 B1 | * | 5/2001 | Farooq | ................... H01L 24/11 257/E21.508 |
| 6,693,362 B2 | * | 2/2004 | Seyama | ................... H01L 23/10 257/723 |

(Continued)

FOREIGN PATENT DOCUMENTS

| | | |
|---|---|---|
| JP | 2000-349225 A | 12/2000 |
| JP | 2004-111415 A | 4/2004 |

(Continued)

OTHER PUBLICATIONS

JP 2013-161180 Office Action dated Sep. 30, 2014; 4pgs.

(Continued)

*Primary Examiner* — Xanthia C Cunningham
(74) *Attorney, Agent, or Firm* — NSIP Law

(57) ABSTRACT

The present invention relates to a substrate structure having electronic components and a method of manufacturing a substrate structure having electronic components and can reduce signal loss and internal resistance and improve process efficiency by bringing a first terminal of a first electronic component and a second terminal of a second electronic component in direct contact with each other or in direct contact with each other by solder to minimize a path between the electronic components.

2 Claims, 7 Drawing Sheets

(56) References Cited

U.S. PATENT DOCUMENTS

| | | | | |
|---|---|---|---|---|
| 6,734,556 | B2* | 5/2004 | Shibata | H01L 21/563 |
| | | | | 257/676 |
| 6,815,829 | B2* | 11/2004 | Shibata | H01L 23/13 |
| | | | | 257/777 |
| 7,198,980 | B2* | 4/2007 | Jiang | H01L 23/3128 |
| | | | | 257/E23.175 |
| 7,402,901 | B2* | 7/2008 | Hatano | H01L 23/5389 |
| | | | | 257/684 |
| 7,659,620 | B2* | 2/2010 | Fernandez | H01L 23/3128 |
| | | | | 257/736 |
| 8,704,352 | B2* | 4/2014 | Hisano | H01L 23/3128 |
| | | | | 257/686 |
| 2001/0013535 | A1* | 8/2001 | Miyake | B23K 20/16 |
| | | | | 228/180.1 |
| 2003/0188886 | A1* | 10/2003 | Fey | H05K 3/242 |
| | | | | 174/256 |
| 2006/0065972 | A1* | 3/2006 | Khan | H01L 23/13 |
| | | | | 257/712 |
| 2013/0188359 | A1* | 7/2013 | Park | H01L 23/3677 |
| | | | | 362/249.02 |

FOREIGN PATENT DOCUMENTS

| | | | | |
|---|---|---|---|---|
| JP | 2011-187919 A | 9/2011 | | |
| JP | 2012-044134 A | 3/2012 | | |
| JP | 2012-164952 A | 8/2012 | | |
| JP | 2012-186440 A | 9/2012 | | |
| KR | 10-2005-0031364 A | 4/2005 | | |
| KR | 10-0736635 B1 | 7/2007 | | |
| KR | 10-0836651 B1 | 6/2008 | | |
| KR | 10-0888579 A | 9/2008 | | |
| KR | 10-2012-0040039 A | 4/2012 | | |
| KR | 1020120037321 | * | 9/2012 | H01L 23/34 |

OTHER PUBLICATIONS

Japanese Office Action issued on Jul. 14, 2015 in counterpart Japanese Application No. 2013-161180 (5 pages with English translation).

Taiwanese Office Action issued on Sep. 2, 2015 in counterpart Taiwanese Application No. 102124537 (11 pages with English translation).

* cited by examiner

SUBSTRATE STRUCTURE HAVING ELECTRONIC COMPONENTS AND METHOD OF MANUFACTURING SUBSTRATE STRUCTURE HAVING ELECTRONIC COMPONENTS

CROSS-REFERENCE TO RELATED APPLICATIONS

Claim and incorporate by reference domestic priority application and foreign priority application as follows:

Cross Reference to Related Application

This application claims the benefit under 35 U.S.C. Section 119 of Korean Patent Application Serial No. 10-2012-0118028, entitled filed Oct. 23, 2012, which is hereby incorporated by reference in its entirety into this application.

BACKGROUND OF THE INVENTION

1. Field of the Invention

The present invention relates to a substrate structure having electronic components and a method of manufacturing a substrate structure having electronic components.

2. Description of the Related Art

In recent times, as the trend of miniaturization and slimming of electronic devices accelerate, techniques of manufacturing a multilayer substrate and embedding various electronic components in the substrate have been proposed.

At this time, the electronic components embedded in the substrate are passive elements such as inductors and capacitors or active elements such as IC chips.

Meanwhile, products in which electronic components are surface-mounted on a surface of a substrate as well as being embedded in the substrate and the embedded electronic components and the surface-mounted electronic components are electrically connected to each other also have been released.

As an example, Patent Document 1 discloses a structure in which a semiconductor chip mounted on a surface of a substrate and a semiconductor chip embedded in the substrate are connected using vias and wiring patterns of more than one stage.

However, in the conventional structures including Patent Document 1 etc., since the electronic component mounted on the surface of the substrate and the electronic component embedded in the substrate are connected by a via etc., a current moving path between the interconnected electronic components is increased, thus increasing internal resistance, occurring signal loss during transmission of signals between the interconnected electronic components, and having limitations in simplification and reliability of processes due to the need for a process of forming a via, etc. to connect electronic components.

RELATED ART DOCUMENT

Patent Document

Patent Document 1: Korean Patent Laid-open Publication No. 2005-0031364

SUMMARY OF THE INVENTION

The present invention has been invented in order to overcome the above-described problems and it is, therefore, an object of the present invention to provide a substrate structure having electronic components that can reduce internal resistance and a signal loss rate and simplify manufacturing processes.

Further, it is another object of the present invention to provide a method of manufacturing a substrate structure having electronic components that can reduce internal resistance and a signal loss rate and simplify manufacturing processes.

In accordance with one aspect of the present invention to achieve the object, there is provided a substrate structure having electronic components, including: a substrate having one surface, the other surface opposite to the one surface, and a cavity formed by penetrating between the one surface and the other surface; a first circuit pattern and a second circuit pattern provided on the one surface of the substrate; a first electronic component inserted in the cavity and having a first terminal formed on a surface; a filler for filling a space between the cavity and the first electronic component; a plated terminal formed in the first terminal of the first electronic component; and a second electronic component mounted on the one surface of the substrate and having a second terminal electrically connected to the plated terminal.

At this time, the plated terminal and the second terminal may be in direct contact with each other by solder.

Further, the plated terminal and the second circuit pattern may have the same height, and the second terminal may be in direct contact with the plated terminal and the second circuit pattern by solder.

Further, the substrate structure having electronic components may further include an insulating portion for covering the first circuit pattern.

Further, the substrate structure having electronic components may further include a molding portion filled in a region between the second electronic component and the substrate.

Further, the substrate structure having electronic components may further include at least one of a third circuit pattern and a fourth circuit pattern provided on the other surface of the substrate.

Further, the filler may be plug ink.

In accordance with another aspect of the present invention to achieve the object, there is provided a method of manufacturing a substrate structure having electronic components, including the steps of: providing a substrate having one surface, the other surface opposite to the one surface, and a cavity formed by penetrating between the one surface and the other surface; attaching a detach film to the one surface of the substrate; fixing a first electronic component by filling a filler in a space between the cavity and the first electronic component after inserting the first electronic component having a first terminal on a surface in the cavity to attach the first electronic component to the detach film; removing the detach film after fixing the first electronic component; forming a first circuit pattern and a second circuit pattern on the one surface of the substrate from which the detach film is removed; forming a plated terminal on a surface of the first terminal from which the detach film is removed; and mounting a second electronic component so that a second terminal of the second component having at least one second terminal on at least one surface is electrically connected to the plated terminal.

At this time, the step of mounting the second electronic component may be performed so that the plated terminal and the second terminal are in direct contact with each other by solder.

Further, the step of forming the first circuit pattern and the second circuit pattern and the step of forming the plated terminal may be performed in the same process so that the plated terminal and the second circuit pattern have the same height, and the step of mounting the second electronic component may be performed so that the second terminal is in direct contact with the plated terminal and the second circuit pattern by solder.

Further, the method of manufacturing a substrate structure having electronic components may further include the step of forming a molding portion by filling an insulating resin in a region between the second electronic component and the substrate.

Further, the filler may be plug ink.

In accordance with still another aspect of the present invention to achieve the object, there is provided a substrate structure having electronic components, including: a substrate having one surface, the other surface opposite to the one surface, and a cavity formed by penetrating between the one surface and the other surface; a first circuit pattern and a second circuit pattern provided on the one surface of the substrate; a first electronic component of which a portion is inserted in the cavity and the remaining portion protrudes outside the cavity and having a first terminal formed on a surface; a filler for filling a space between the cavity and the first electronic component; a first surface treatment layer provided on an upper surface of the first terminal of the first electronic component; and a second electronic component mounted on the one surface of the substrate and having a second terminal electrically connected to the first surface treatment layer.

At this time, one surface of the first electronic component may be positioned on the same horizontal plane as a horizontal plane where an upper surface of the second circuit pattern is positioned.

Further, the first surface treatment layer and the second terminal may be in direct contact with each other by solder.

Further, the substrate structure having electronic components may further include a second surface treatment layer provided on the upper surface of the second circuit pattern, and the second terminal may be in direct contact with the first surface treatment layer and the second circuit pattern by solder.

Further, the substrate structure having electronic components may further include a third surface treatment layer provided on a lower surface of the second terminal, and the third surface treatment layer may be in direct contact with the first surface treatment layer by solder.

In accordance with still another aspect of the present invention to achieve the object, there is provided a method of manufacturing a substrate structure having electronic components, including the steps of: providing a substrate having one surface, the other surface opposite to the one surface, a seed layer made of a conductive material on the one surface, and a cavity formed by penetrating between an upper surface of the seed layer and the other surface; attaching a detach film to the upper surface of the seed layer; fixing a first electronic component by filling a filler in a space between the cavity and the first electronic component after inserting the first electronic component having a first terminal on a surface in the cavity to attach the first electronic component to the detach film; removing the detach film after fixing the first electronic component; forming a first circuit pattern and a second circuit pattern by patterning the seed layer from which the detach film is removed; forming a first surface treatment layer on a surface of the first terminal from which the detach film is removed; and mounting a second electronic component so that a second terminal of the second component having at least one second terminal on at least one surface is electrically connected to the first surface treatment layer.

At this time, the step of mounting the second electronic component may be performed so that the first surface treatment layer and the second terminal are in direct contact with each other by solder.

Further, the method of manufacturing a substrate structure having electronic components may further include the step of forming a second surface treatment layer on an upper surface of the second circuit pattern, wherein upper surfaces of the first surface treatment layer and the second surface treatment layer may be on the same horizontal plane, and the step of mounting the second electronic component may be performed so that the first surface treatment layer and the second treatment layer are in direct contact with the second terminal by solder.

Further, the method of manufacturing a substrate structure having electronic components may further include the step of forming a third surface treatment layer on a lower surface of the second terminal, and the step of mounting the second electronic component may be performed so that the third surface treatment layer is in direct contact with the first surface treatment layer by solder.

At this time, the first surface treatment layer may be an Au-based SF coating layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
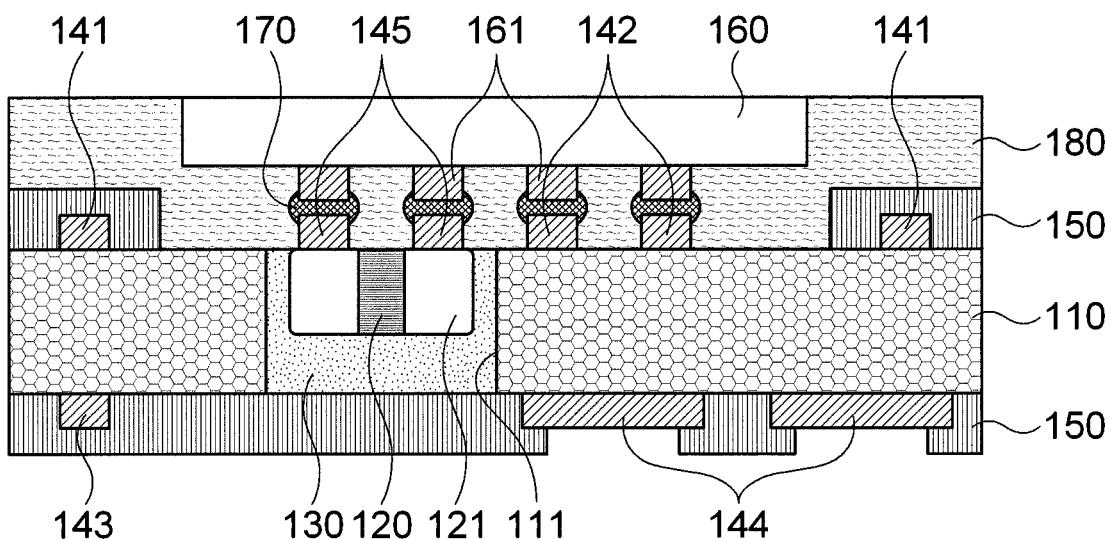
FIG. 1 is a cross-sectional view schematically showing a substrate structure having electronic components in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

FIG. 1 is a cross-sectional view schematically showing a substrate structure 100 having electronic components in accordance with an embodiment of the present invention.

Referring to FIG. 1, a substrate structure 100 having electronic components in accordance with an embodiment of the present invention may include a substrate 110, a first circuit pattern 141, a second circuit pattern 142, a first electronic component 120, a second electronic component 160, a plated terminal 145, and a filler 130.

First, the substrate 110 may be formed in a plate shape by using a common insulating material.

At this time, the substrate 110 may be made of a metal material, and an insulating layer may be provided on a surface of the substrate 110.

Further, the substrate 110 may perform a role of a common core layer in the substrate structure 100 having electronic components in accordance with an embodiment of the present invention.

Meanwhile, a cavity may be formed in a region of the substrate 110 to pass through an upper surface and a lower surface of the substrate 110, and the first electronic component 120 may be embedded in the cavity.

Further, a circuit pattern, which is made of a conductive material, may be formed on one surface or both surfaces of the substrate 110. For the convenience of description, in the present specification, the circuit patterns formed on the upper surface of the substrate 110 are referred to as the first circuit pattern 141 and the second circuit pattern 142, and the circuit patterns formed on the lower surface of the substrate 110 are referred to as a third circuit pattern 143 and a fourth circuit pattern 144.

As described above, the first electronic component 120 may be embedded in the cavity of the substrate 110.

At this time, the first electronic component 120 may be various active elements, passive elements, etc. In the drawing appended to the present specification, it is shown as an example that the first electronic component 120 is a passive element, particularly a capacitor referred to as an MLCC.

A first terminal 121 may be provided on an outer surface of the first electronic component 120 to transceive a current or a signal with the outside.

In embedding the first electronic component 120 in the cavity, as shown in FIG. 1, the first electronic component 120 may be embedded in the cavity so that one surface of the first electronic component 120 and one surface of the substrate 110 are positioned on the same horizontal plane.

Meanwhile, the filler 130 is filled in a space between the cavity and the first electronic component 120 to stably fix the first electronic component 120 in the cavity.

At this time, the filler 130 may be plug ink.

Further, the plated terminal 145 may be formed in the first terminal 121 of the first electronic component 120.

The plated terminal 145 may be formed together in the process of forming the above-described first circuit pattern 141 and second circuit pattern 142.

Further, the plated terminal 145 may be formed at the same height as the second circuit pattern 142.

Next, the second electronic component 160 also may be various active elements, passive elements, etc. In the drawing appended to the present specification, it is shown as an example that the second electronic component 160 is an active element such as an active die or an IC chip.

A plurality of external connection terminals may be provided on one surface of the active element, and the external connection terminal will be referred to as a second terminal 161 in the present specification.

Meanwhile, the plated terminal 145 of the above-described first electronic component 120 may be directly connected to the second terminal 161 of the second electronic component 160.

At this time, the plated terminal 145 and the second terminal 161 may be in direct contact with each other by solder 170.

That is, a reflow process may be performed while making the second terminal 161 and the plated terminal 145 adjacent to each other in a state in which solder resist is applied on at least one of the second terminal 161 and the plated terminal 145 to physically couple and electrically conduct the second terminal 161 and the plated terminal 145 at the same time.

Further, in some cases, it is needed for the second electronic component 160 to be electrically connected to the second circuit pattern 142 etc. as well as the first electronic component 120. In the substrate structure 100 having electronic components in accordance with an embodiment of the present invention, since the plated terminal 145 and the second circuit pattern 142 can be formed at the same height, the second terminals 161 can be coupled with the second circuit patterns 142 as well as the plated terminal 145.

Accordingly, a plurality of electronic components formed on different layers can be directly connected to each other and a path between the electronic components can be minimized, thus reducing signal loss and overcoming various problems due to internal resistance.

Further, in the prior art, since electrical connection between electronic components should be implemented using various vias, conductive patterns, etc., the number of processes is increased, but in the substrate structure 100 having electronic components in accordance with an embodiment of the present invention, it is possible to overcome these problems.

Meanwhile, in the present specification and drawings, the circuit patterns formed on the one surface of the substrate 110 are classified into the first circuit pattern 141 and the second circuit pattern 142. The second circuit pattern 142 means a pattern in direct contact with the second terminal 161 of the second electronic component 160, and the first circuit pattern 141 means a pattern which is not in direct contact with the second terminal 161 of the second electronic component 160 and in some cases, means a pattern applied with an insulating portion 150 to secure insulation.

However, this is only the classification for the convenience of description and understanding and should not be interpreted as limiting the scope of the present invention.

Meanwhile, a molding portion 180 may be further provided to firmly support coupling while protecting the second electronic component 160 and the coupled portion in a state in which the second terminal 161 of the second electronic component 160 and the plated terminal 145 are coupled with each other.

At this time, the molding portion 180 may be formed by filling an insulating resin in a region between the second electronic component 160 and the substrate 110.

Meanwhile, as shown in FIG. 1, various circuit patterns such as the third circuit pattern 143 and the fourth circuit pattern 144 may be provided on the other surface of the substrate 110, that is, on the lower surface of the substrate 110.

Further, although not shown, a through hole via (THV) or a typical via, which passes through the substrate 110, may be provided to electrically connect the first circuit pattern 141 formed on the one surface of the substrate 110 and the third circuit pattern 143 formed on the other surface of the substrate 110.

Further, for electrical connection with other substrate structures etc., a solder 170 ball etc. may be provided on a surface of the fourth circuit pattern 144.

FIGS. 2a to 2f are process cross-sectional views schematically showing a method of manufacturing a substrate structure having electronic components in accordance with an embodiment of the present invention.

Hereinafter, a method of manufacturing a substrate structure having electronic components in accordance with an embodiment of the present invention will be specifically described with reference to FIGS. 2a to 2f.

Figure 2A:
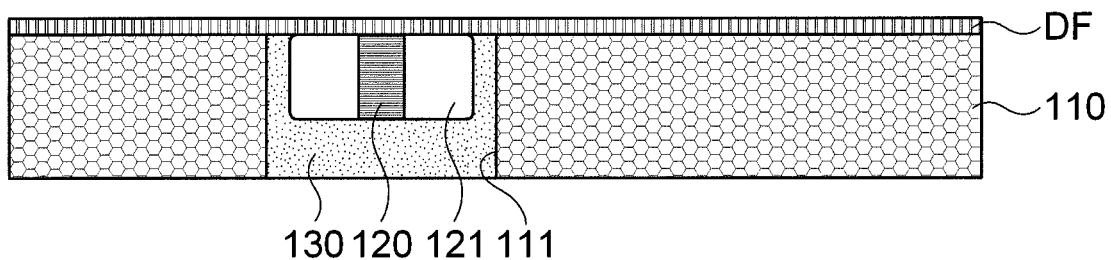
FIGS. 2a to 2f are process cross-sectional views schematically showing a method of manufacturing a substrate structure having electronic component in accordance with an embodiment of the present invention.

First, referring to FIG. 2a, a detach film (DF) is attached to one surface of a substrate 110 having a cavity, and a first electronic component 120 is inserted in the cavity so that one surface of the first electronic component 120 is attached to the DF.

At this time, since the DF can form a plane, the one surface of the first electronic component 120 can be positioned on the same horizontal plane as the one surface of the substrate 110.

Next, a filler 130 such as plug ink is filled in a region between the cavity and the first electronic component 120 to firmly fix the first electronic component 120 in the cavity.

Figure 2B:
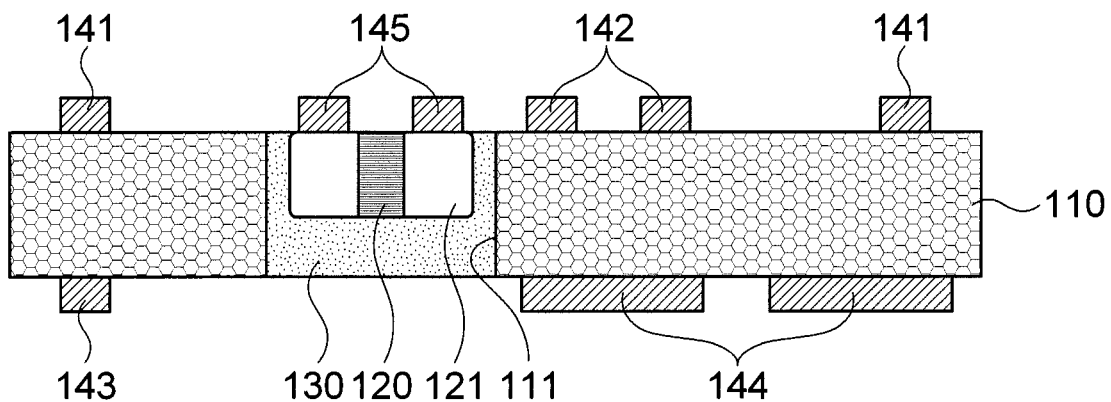

Next, referring to FIG. 2b, after removing the DF, a first circuit pattern 141, a second circuit pattern 142, and a plated terminal 145 are formed.

At this time, the first circuit pattern 141, the second circuit pattern 142, and the plated terminal 145 may be formed at the same time by applying various methods of forming a conductive pattern.

Further, a third circuit pattern 143, a fourth circuit pattern 144, etc. may be formed on the other surface of the substrate 110, that is, on a lower surface of the substrate 110 when necessary.

Figure 2C:
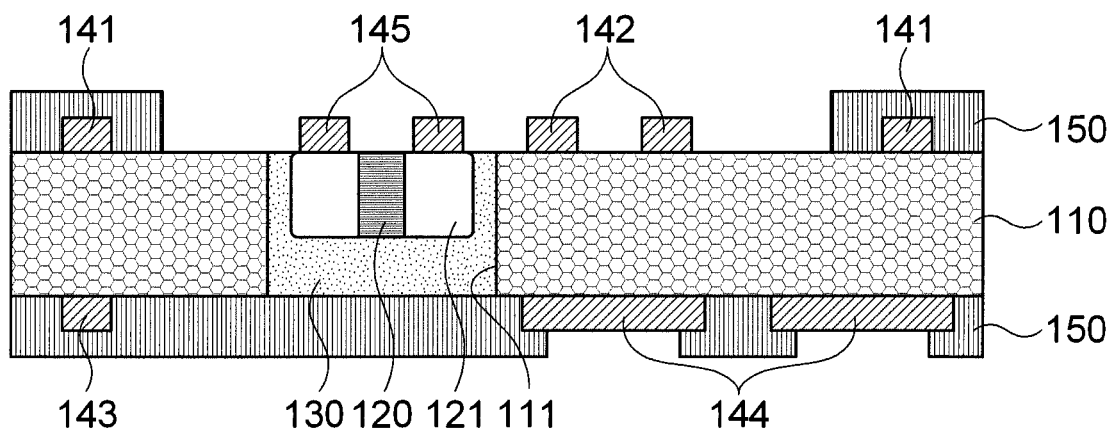

Further, as shown in FIG. 2c, an insulating portion 150 may be formed to cover a portion required to secure insulation, that is, the entire first circuit pattern 141 and third circuit pattern 143 and a portion of the fourth circuit pattern 144 when necessary.

At this time, the insulating portion 150 may be formed by removing an insulating material from a region where a second electronic component 160 is to be coupled with the plated terminal 145 and the second circuit pattern 142 or a region of the fourth circuit pattern 144 where a solder 170 bump is to be formed after uniformly applying the insulating material on the entire one surface or other surface of the substrate 110 and curing the applied material.

Figure 2D:
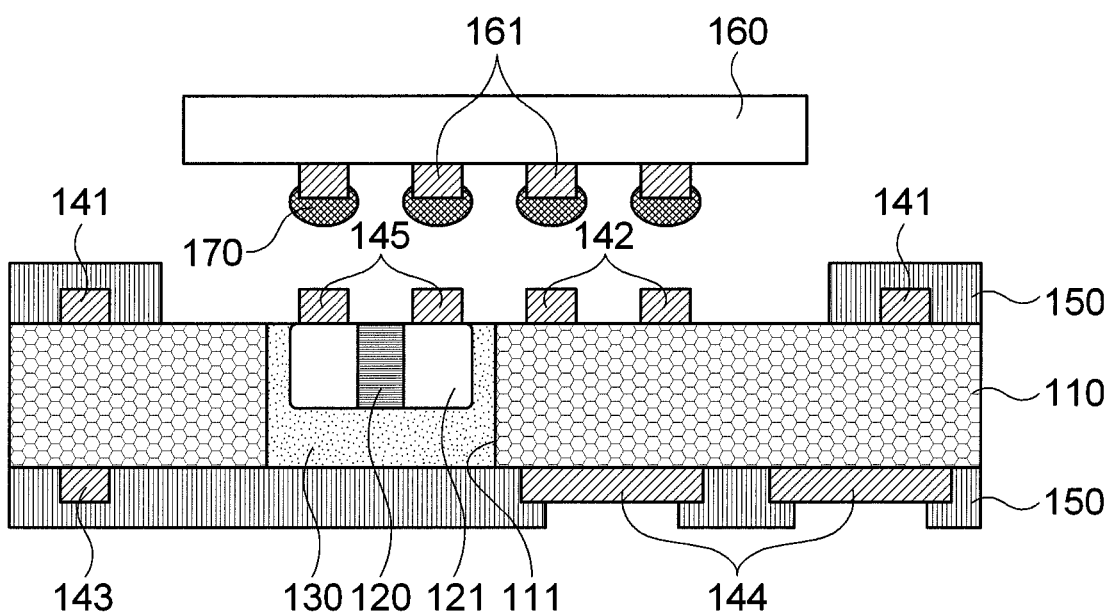

Next, referring to FIG. 2d, the second electronic component 160 having a plurality of second terminals 161 on a bottom is mounted.

At this time, solder resist may be applied on the second terminal 161.

Figure 2E:
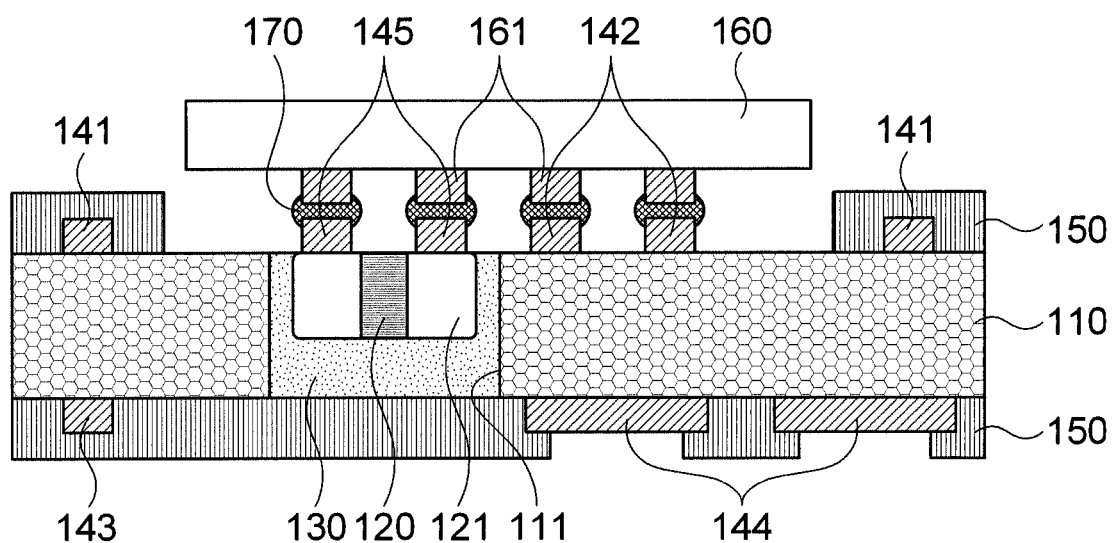

Next, referring to FIG. 2e, the second electronic component 160 is mounted so that the second terminal 161 of the second electronic component 160 is in direct contact with the plated terminal 145 by solder 170.

That is, the second terminal 161 and the plated terminal 145 are physically and electrically coupled by aligning the second electronic component 160 on the substrate 110 and pressing the second electronic component 160 downward in a state in which the second terminal 161 and the plated terminal 145 face each other while supplying a hot wind at this time to cure the solder resist.

Further, some of the second terminals 161 may be coupled with the second circuit pattern 142 in a similar manner when necessary.

Figure 2F:
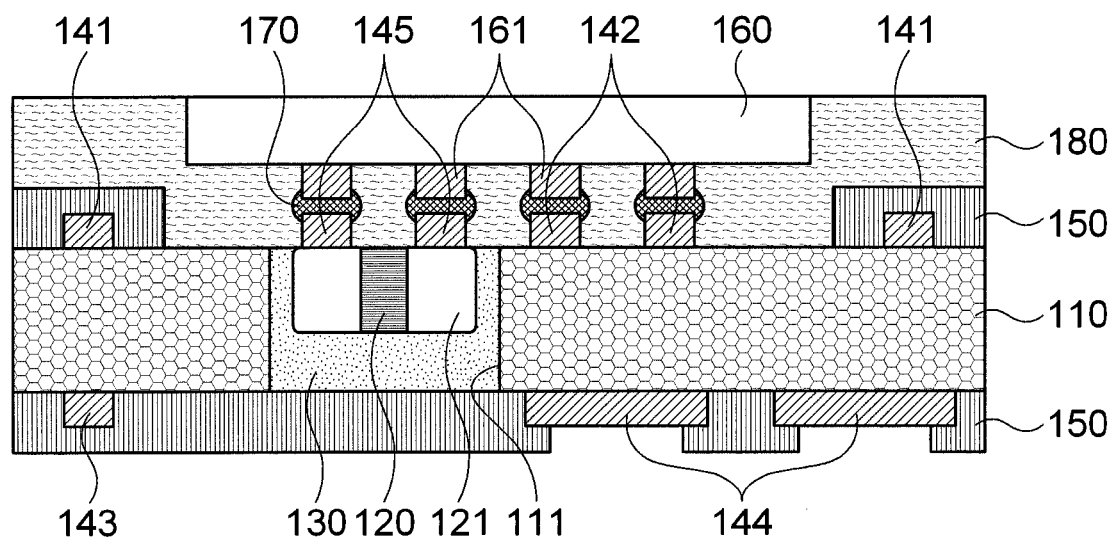

Next, referring to FIG. 2f, a molding portion 180 is formed by filling an insulating resin in a region between the second electronic component 160 and the substrate 110.

Accordingly, by applying the method of manufacturing a substrate structure 100 having electronic components in accordance with an embodiment of the present invention, it is possible to improve process efficiency since processes can be simplified compared to a conventional method requiring a process of forming a via, a process of forming a conductive pattern, and a process of mounting an electronic component, etc.

Figure 3:
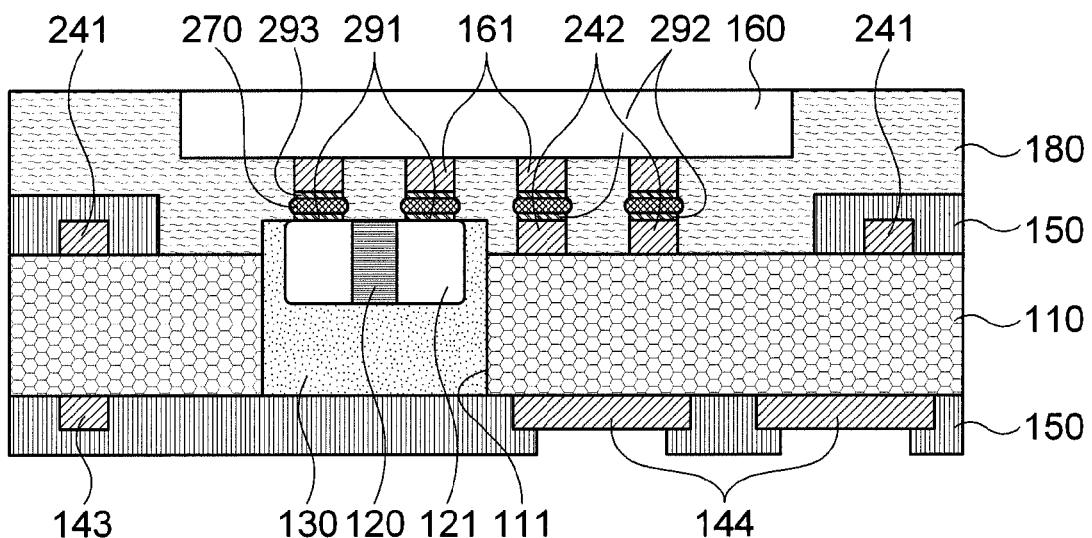
FIG. 3 is a cross-sectional view schematically showing a substrate structure having electronic components in accordance with another embodiment of the present invention.

FIG. 3 is a cross-sectional view schematically showing a substrate structure 200 having electronic components in accordance with another embodiment of the present invention.

Referring to FIG. 3, a substrate structure 200 having electronic components in accordance with another embodiment of the present invention includes a substrate 110, a first circuit pattern 241, a second circuit pattern 242, a first electronic component 120, a second electronic component 160, a first surface treatment layer 291, and a filler 130.

Hereinafter, a configuration in accordance with the present embodiment will be described centering on differences from the above-described embodiment, and repeated descriptions will be omitted.

In accordance with the present embodiment, the first electronic component 120 is embedded in a cavity of the substrate 110. A portion of the first electronic component 120 may be inserted in the cavity, and the remaining portion thereof may protrude outside the cavity.

Meanwhile, the filler 130 such as plug ink is filled in a space between the cavity and the first electronic component 120 to stably fix the first electronic component 120 in the cavity.

Further, the filler 130 also may be provided in the region from which the first electronic component 120 protrudes.

At this time, one surface of the first electronic component 120 may be positioned on the same horizontal plane on a horizontal plane where an upper surface of the second circuit pattern 242 is positioned.

Meanwhile, a first terminal 121 may be positioned on the one surface of the first electronic component 120, and the first terminal 121 may be directly connected to a second terminal 161 of the second electronic component 160.

However, when the first electronic component 120 is an MLCC, generally, since there is a limitation in forming roughness on a surface of an external electrode of the MLCC, the MLCC may not be firmly coupled when being in contact with other conductive materials.

Therefore, in the substrate structure 200 having electronic components in accordance with the present embodiment, the first surface treatment layer 291 is provided on a surface of the first terminal 121 of the first electronic component 120.

At this time, the first surface treatment layer 291 may be implemented with an Au-based SF coating layer.

Further, due to the same reason, a second surface treatment layer 292 and a third surface treatment layer 293 may be provided on an upper surface of the second circuit pattern 242 and a lower surface of the second terminal 161 of the second electronic component 160, respectively.

Meanwhile, solder 270 may be provided between the first surface treatment layer 291 and the second terminal 161 of the second electronic component 160 or between the first surface treatment layer 291 and the second surface treatment layer 292 to bring direct contact therebetween.

FIGS. 4a to 4g are process cross-sectional views schematically showing a method of manufacturing a substrate structure having electronic components in accordance with another embodiment of the present invention.

Hereinafter, a method of manufacturing a substrate structure having electronic components in accordance with another embodiment of the present invention will be specifically described with reference to FIGS. 4a to 4g.

However, a configuration in accordance with the present embodiment will be described centering on differences from the above-described embodiment, and repeated descriptions will be omitted.

Figure 4A:
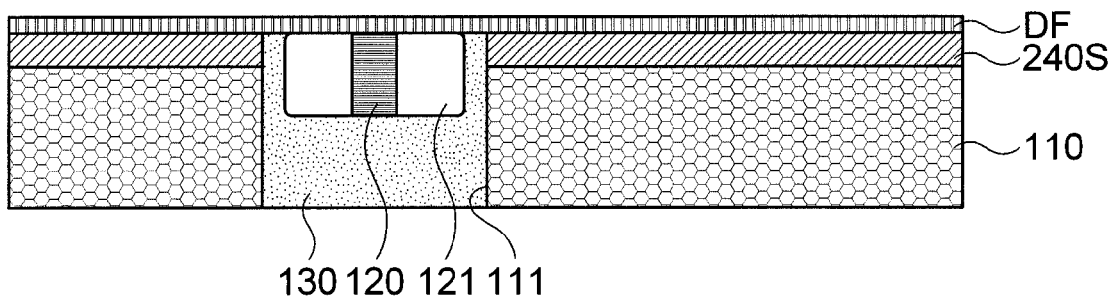
FIGS. 4a to 4g are process cross-sectional views schematically showing a method of manufacturing a substrate structure having electronic component in accordance with another embodiment of the present invention.

First, referring to FIG. 4a, a substrate 110, which has a seed layer 240S made of a metal material on one surface and a cavity formed by penetrating between an upper surface of the seed layer 240S and the other surface of the substrate 110, is provided.

Next, a detach film (DF) is attached to the upper surface of the seed layer 240S, and a first electronic component 120 is inserted in the cavity so that one surface of the first electronic component 120 is attached to the DF.

At this time, since the DF can form a plane, the one surface of the first electronic component 120 can be positioned on the same horizontal plane as the upper surface of the seed layer 240S.

Next, a filler 130 such as plug ink is filled in a region between the cavity and the first electronic component 120 to firmly fix the first electronic component 120 in the cavity.

Figure 4B:
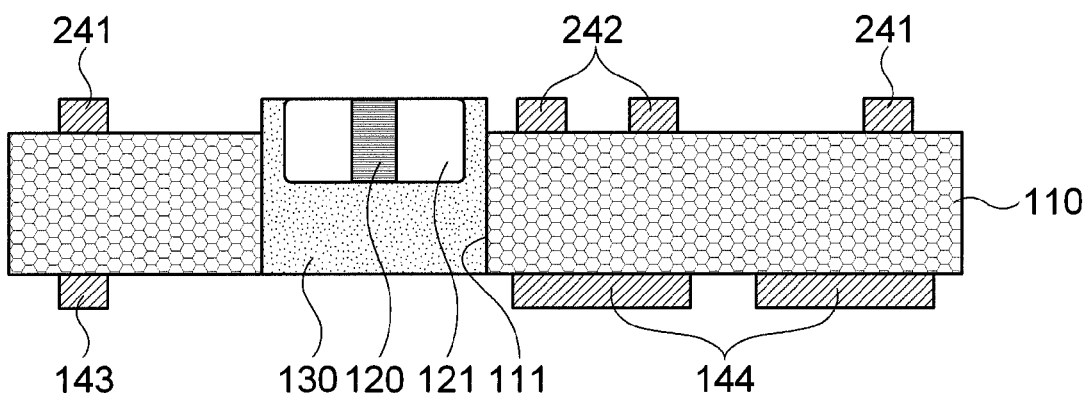

Next, referring to FIG. 4b, a first circuit pattern 241 and a second circuit pattern 242 are formed by patterning the seed layer 240S after removing the DF.

At this time the first circuit pattern 241 and the second circuit pattern 242 may be formed by applying various methods of forming a conductive pattern.

Further, a third circuit pattern 143, a fourth circuit pattern 144, etc. may be formed on the other surface of the substrate 110, that is, on a lower surface of the substrate 110 when necessary.

Figure 4C:
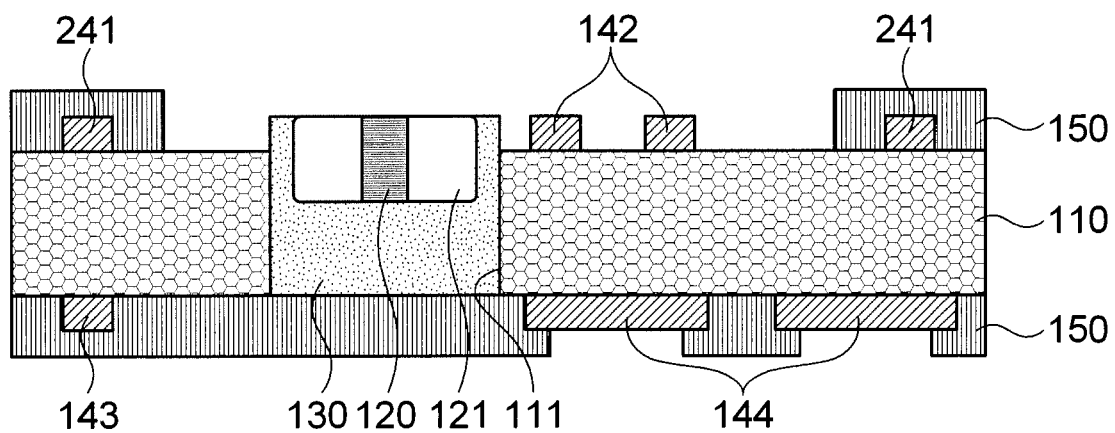

Further, as shown in FIG. 4c, an insulating portion 150 may be formed to cover a portion required to secure insulation, that is, the entire first circuit pattern 241 and third circuit pattern 243 and a portion of the fourth circuit pattern 144 when necessary.

Figure 4D:
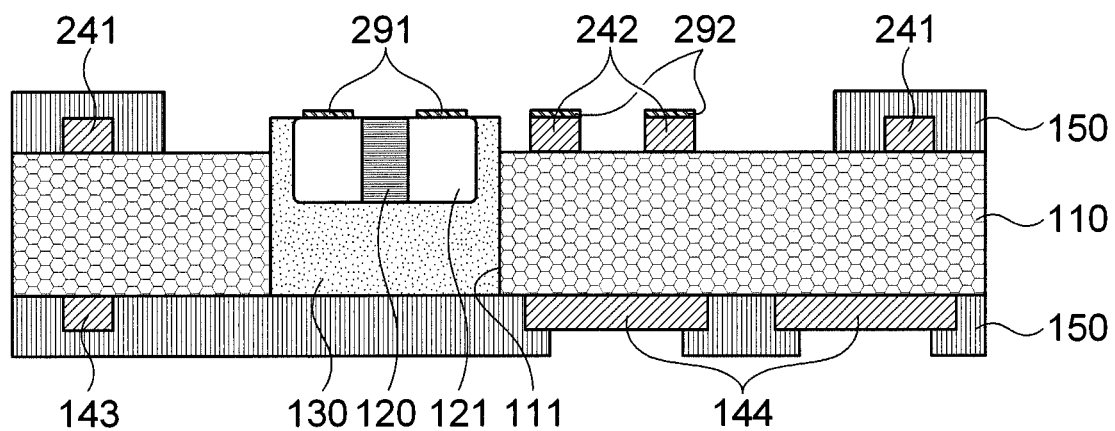

Next, referring to FIG. 4d, a first surface treatment layer 291 is formed on a surface of a first terminal 121 of the first electronic component 120 from which the DF is removed.

At this time, the first surface treatment layer 291 may be implemented with an Au-based SF coating layer, and a second surface treatment layer 292 may be provided on each of an upper surface of the second circuit pattern 242 and a lower surface of a second terminal 161 of a second electronic component 160.

Figure 4E:
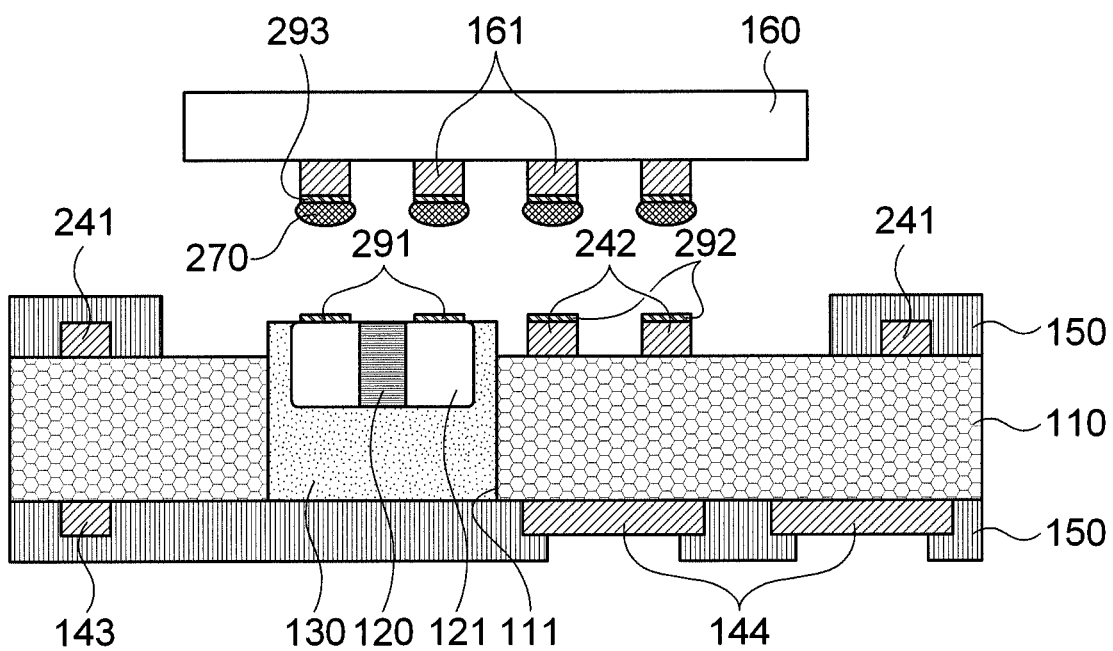

Next, referring to FIG. 4e, the second electronic component 160 having a plurality of second terminals 161 on a bottom is mounted.

At this time, a third surface treatment layer 293 may be provided on the lower surface of the second terminal 161, and solder paste may be applied under the third surface treatment layer 293.

Figure 4F:
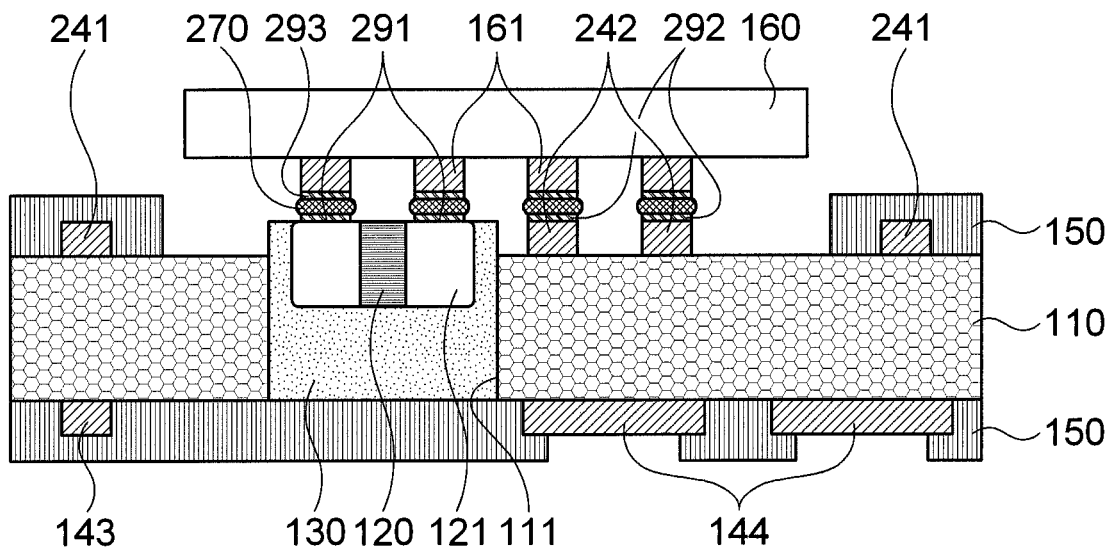

Next, referring to FIG. 4f, the second electronic component 160 is mounted so that the second terminal 161 of the second electronic component 160 or the third surface treatment layer 293 is in direct contact with the first surface treatment layer 291 by solder 270.

Further, some of the second terminals 161 may be coupled with the second circuit pattern 242 in a similar manner when necessary.

Figure 4G:
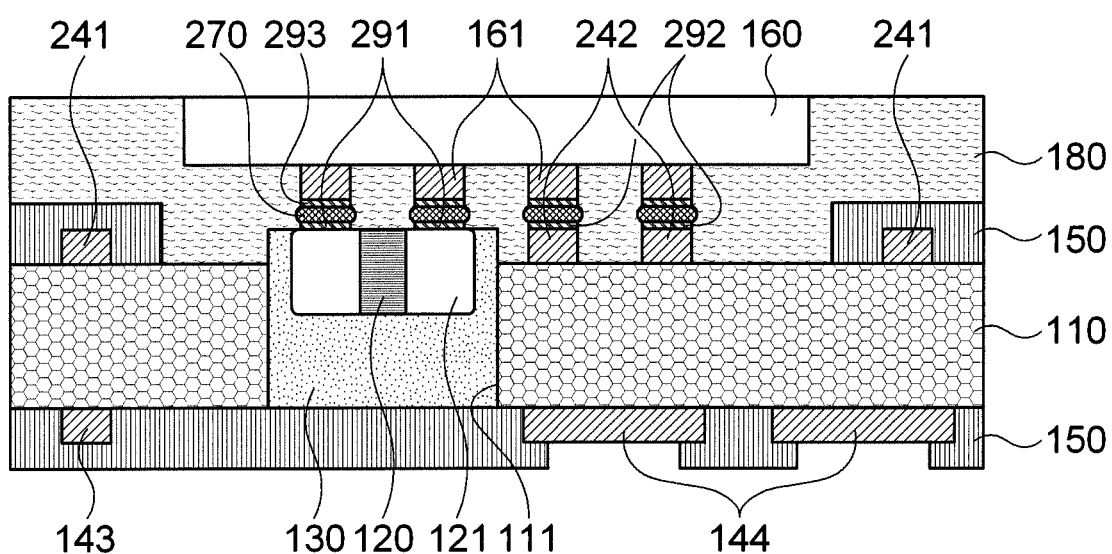

Next, referring to FIG. 4g, a molding portion 180 is formed by filling an insulating resin in a region between the second electronic component 160 and the substrate 110.

Since the present invention configured as above directly connects a plurality of electronic components formed on different layers in a multilayer substrate structure, it is possible to reduce signal loss and internal resistance by minimizing a path between the electronic components.

Further, it is possible to improve manufacturing efficiency by simplifying processes compared to the prior art.

What is claimed is:

1. A substrate structure having electronic components, comprising:
   a substrate having one surface, the other surface opposite to the one surface, and a cavity formed by penetrating between the one surface and the other surface;
   a first circuit pattern and a second circuit pattern provided on the one surface of the substrate;
   a first electronic component of which a portion is inserted in the cavity and the remaining portion protrudes outside the cavity and having a first terminal formed on a surface;
   a filler for filling a space between the cavity and the first electronic component;
   a first surface treatment layer provided on an upper surface of the first terminal of the first electronic component;
   a second electronic component mounted on the one surface of the substrate and having a second terminal electrically connected to the first surface treatment layer;
   a second surface treatment layer provided on the upper surface of the second circuit pattern; and
   a third surface treatment layer provided on a lower surface of the second terminal,
   wherein an upper surface of the first electronic component is positioned higher than an upper surface of the substrate,
   wherein the first terminal is formed on the upper surface of the first electronic component;
   wherein the second terminal is provided in plurality, and some of the plurality of second terminals are coupled to the first terminal and a rest of the plurality of second terminals are coupled to the second circuit pattern;
   wherein the first surface treatment layer and the third surface treatment layer are in direct contact with each other by way of solder, and
   wherein the second surface treatment layer and the third surface treatment layer are in direct contact with each other by way of solder.

2. The substrate structure having electronic components according to claim 1, wherein the upper surface of the first electronic component is positioned on the same horizontal plane as a horizontal plane where the upper surface of the second circuit pattern is positioned.

* * * * *